United States Patent
Park

(10) Patent No.: US 12,144,126 B2
(45) Date of Patent: Nov. 12, 2024

(54) FOLDABLE DISPLAY DEVICE HAVING SUPPORT STRUCTURE WITH MULTIPLE LAYERS

(71) Applicant: Samsung Display Co., Ltd., Yongin-si (KR)

(72) Inventor: Changmin Park, Gwangmyeong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 31 days.

(21) Appl. No.: 17/395,821

(22) Filed: Aug. 6, 2021

(65) Prior Publication Data

US 2022/0151083 A1 May 12, 2022

(30) Foreign Application Priority Data

Nov. 12, 2020 (KR) .................. 10-2020-0151181

(51) Int. Cl.
*H05K 5/00* (2006.01)
*H05K 5/03* (2006.01)
*H05K 5/04* (2006.01)
*H05K 7/20* (2006.01)

(52) U.S. Cl.
CPC ............ *H05K 5/0017* (2013.01); *H05K 5/03* (2013.01); *H05K 5/04* (2013.01); *H05K 7/2039* (2013.01)

(58) Field of Classification Search
CPC .................................................. G06F 1/1652
See application file for complete search history.

(56) References Cited

U.S. PATENT DOCUMENTS

| | | | |
|---|---|---|---|
| 9,069,521 B2 * | 6/2015 | Lee | G09F 9/301 |
| 9,164,547 B1 | 10/2015 | Kwon et al. | |
| 9,772,656 B2 * | 9/2017 | Chong | H01L 27/1255 |
| 9,983,424 B2 * | 5/2018 | Kim | H10K 59/87 |
| 10,198,041 B2 * | 2/2019 | Myeong | G06F 1/1681 |
| 10,367,173 B1 * | 7/2019 | Wu | H04M 1/0268 |
| 10,383,239 B2 * | 8/2019 | Lee | H05K 5/0017 |
| 10,488,887 B2 * | 11/2019 | Yamazaki | G06F 1/1618 |

(Continued)

FOREIGN PATENT DOCUMENTS

| | | |
|---|---|---|
| KR | 10-2017-0026908 | 3/2017 |
| KR | 10-2015398 | 8/2019 |
| KR | 10-2020-0089376 | 7/2020 |

*Primary Examiner* — Rockshana D Chowdhury
*Assistant Examiner* — Douglas R Burtner
(74) *Attorney, Agent, or Firm* — KILE PARK REED & HOUTTEMAN PLLC

(57) ABSTRACT

A display device includes a display panel and a lower member. The lower member includes a first support layer, a second support layer, and a cover layer. The first support layer includes a first support portion, a first protection portion extending from the first support portion, and at least one of a first groove and a first opening in a region of the first support portion and a region of the first protection portion. The second support layer includes a second support portion, a second protection portion, and at least one of a second groove and a second opening in a region of the second support portion and a region of the second protection portion. The cover layer is attached to the first support layer and the second support layer and corresponds to the first and second non-folding regions and the folding region.

22 Claims, 15 Drawing Sheets

(56) References Cited

U.S. PATENT DOCUMENTS

| | | | |
|---|---|---|---|
| 10,734,612 B2* | 8/2020 | Wu | H01L 33/58 |
| 10,755,991 B2* | 8/2020 | Park | B32B 27/365 |
| 10,773,198 B2* | 9/2020 | Zeiler | B01D 29/21 |
| 10,910,589 B2* | 2/2021 | Jeong | H10K 50/84 |
| 10,918,976 B2* | 2/2021 | Miller | B01D 46/0031 |
| 10,976,873 B2* | 4/2021 | Shin | H04M 1/0268 |
| 11,163,330 B2* | 11/2021 | Kim | G06F 1/1643 |
| 11,175,693 B2* | 11/2021 | Song | G06F 1/1616 |
| 11,204,627 B2* | 12/2021 | Park | H04M 1/0268 |
| 11,296,286 B2* | 4/2022 | Seo | G06F 1/1652 |
| 11,349,088 B2* | 5/2022 | Dong | H10K 77/111 |
| 11,395,415 B2* | 7/2022 | Gu | H10K 77/111 |
| 11,442,202 B2* | 9/2022 | Park | H05K 5/0017 |
| 11,455,005 B2* | 9/2022 | Seo | G06F 1/1681 |
| 11,455,914 B2* | 9/2022 | Yoon | G06F 1/1641 |
| 11,470,734 B2* | 10/2022 | Sim | H04M 1/0216 |
| 11,474,559 B2* | 10/2022 | Kim | G06F 1/1652 |
| 11,489,120 B2* | 11/2022 | Park | H10K 85/1135 |
| 11,528,819 B2* | 12/2022 | Lee | H10K 59/87 |
| 11,546,986 B2* | 1/2023 | Wang | H05K 1/028 |
| 11,594,710 B2* | 2/2023 | Horiuchi | H10K 50/84 |
| 2017/0060188 A1* | 3/2017 | Han | G06F 1/1641 |
| 2017/0061836 A1* | 3/2017 | Kim | G06F 1/1626 |
| 2017/0062742 A1* | 3/2017 | Kim | H10K 50/844 |
| 2019/0204867 A1* | 7/2019 | Song | G09G 3/3208 |
| 2019/0272407 A1* | 9/2019 | Park | G06V 40/1329 |
| 2019/0302850 A1* | 10/2019 | Park | H04M 1/0268 |
| 2020/0047451 A1* | 2/2020 | Dong | B32B 27/365 |
| 2020/0229312 A1 | 7/2020 | Ha | |
| 2020/0272203 A1* | 8/2020 | Kim | B32B 27/40 |
| 2020/0319672 A1* | 10/2020 | Kim | G06F 1/1656 |
| 2020/0389986 A1* | 12/2020 | Tsuchihashi | G06F 1/1616 |
| 2021/0029841 A1* | 1/2021 | Kim | G06F 1/1616 |
| 2021/0092855 A1* | 3/2021 | Choi | H05K 5/03 |
| 2021/0141418 A1* | 5/2021 | Min | G06F 1/1637 |
| 2021/0165447 A1* | 6/2021 | Wang | G06F 1/1681 |
| 2021/0174711 A1* | 6/2021 | Cho | H10K 59/10 |
| 2021/0208709 A1* | 7/2021 | Shin | G06F 1/1641 |
| 2021/0249625 A1* | 8/2021 | Kim | G06F 1/1643 |
| 2021/0259119 A1* | 8/2021 | Seo | G06F 1/1652 |
| 2021/0265578 A1* | 8/2021 | Lee | B32B 15/09 |
| 2021/0287576 A1* | 9/2021 | Park | B32B 17/06 |
| 2022/0005386 A1* | 1/2022 | Kim | G06F 1/1652 |
| 2022/0043187 A1* | 2/2022 | Choi | G06F 1/1626 |
| 2022/0043485 A1* | 2/2022 | Park | H05K 5/04 |
| 2022/0091689 A1* | 3/2022 | Kishimoto | G06F 1/1643 |
| 2022/0113824 A1* | 4/2022 | Kishimoto | H10K 59/40 |
| 2022/0114923 A1* | 4/2022 | Ha | H04M 1/0268 |
| 2022/0147102 A1* | 5/2022 | Kishimoto | G06F 1/1641 |
| 2022/0147107 A1* | 5/2022 | Wang | G06F 1/1616 |
| 2022/0149337 A1* | 5/2022 | Horiuchi | G06F 1/1652 |
| 2022/0159847 A1* | 5/2022 | Ahn | G06F 1/1616 |
| 2023/0021348 A1* | 1/2023 | Cho | G06F 1/1616 |
| 2023/0055609 A1* | 2/2023 | Seo | H05K 5/0217 |
| 2023/0154361 A1* | 5/2023 | Ha | H04M 1/0216 361/679.01 |
| 2023/0244271 A1* | 8/2023 | Shin | G06F 1/1652 361/679.27 |
| 2023/0273694 A1* | 8/2023 | Shin | G06F 1/1652 345/156 |
| 2023/0280503 A1* | 9/2023 | Kim | G09F 9/301 361/679.02 |
| 2024/0012453 A1* | 1/2024 | Gwak | G06F 1/1652 |
| 2024/0015894 A1* | 1/2024 | Shin | H10K 77/111 |

\* cited by examiner

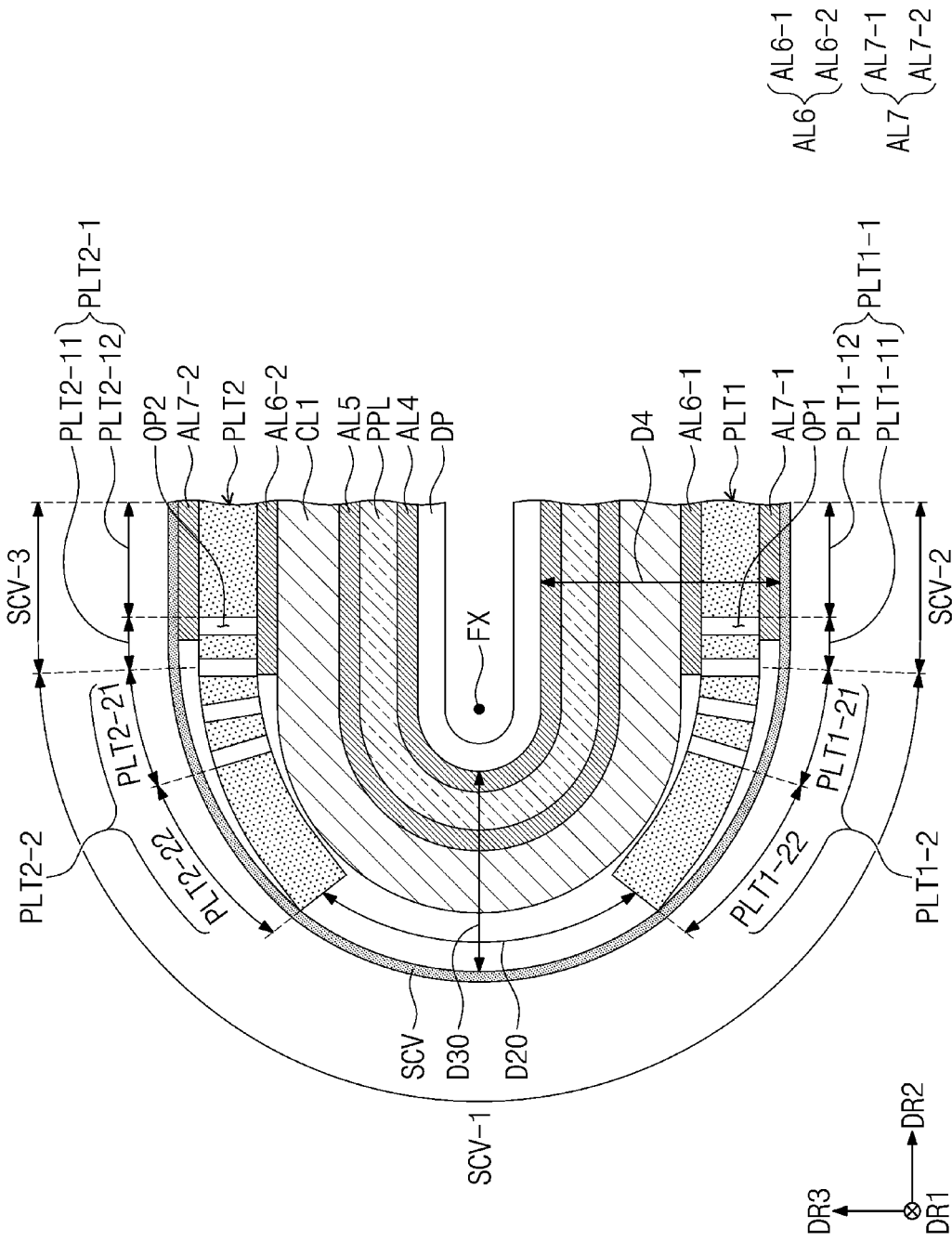

FOLDABLE DISPLAY DEVICE HAVING SUPPORT STRUCTURE WITH MULTIPLE LAYERS

CROSS-REFERENCE TO RELATED APPLICATION(S)

This application claims priority to and benefits of Korean Patent Application No. 10-2020-0151181 under 35 U.S.C. § 119, filed on Nov. 12, 2020, in the Korean Intellectual Property Office, the entire contents of which are hereby incorporated by reference.

BACKGROUND

The disclosure relates to a foldable display device.

A display device includes a display region which is activated by an electrical signal applied thereto. The display device senses an input, which is provided from the outside through the display region, and provides image information to a user through the display region. As the display devices with a variety of shapes are developed, the display regions are also being developed in a variety of shapes. To improve the user's convenience in portability and the space efficiency in residential areas, many studies are being conducted to develop a display device where the shape can be changed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An embodiment provides a foldable display device with improved reliability.

According to an embodiment, a display device may include a display panel and a lower member. The display panel may include a first non-folding region, a second non-folding region, and a folding region, which is disposed between the first non-folding region and the second non-folding region in a first direction. The lower member may be disposed below the display panel and may include a first support layer, a second support layer, and a cover layer. The first support layer may include a first support portion, corresponding to the first non-folding region, a first protection portion extending from the first support portion and corresponding to the folding region, and at least one of a first groove and a first opening in a first region of the first support portion adjacent to the first protection portion and a first region of the first protection portion adjacent to the first support portion. The second support layer may include a second support portion corresponding to the second non-folding region, a second protection portion extending from the second support portion and corresponding to the folding region, and at least one of a second groove and a second opening in a first region of the second support portion adjacent to the second protection portion and a first region of the second protection portion adjacent to the second support portion. The cover layer may be disposed below and attached to the first support layer and the second support layer and may correspond to the first non-folding region, the second non-folding region, and the folding region.

In an embodiment, the first groove may be provided in plural in the first region of the first support portion and in the first region of the first protection portion. The first grooves may be spaced apart from each other by a uniform distance in the first direction.

In an embodiment, the plurality of first grooves may have a same width.

In an embodiment, the first opening may be provided in plural in the first region of the first support portion and in the first region of the first protection portion. The plurality of first openings may be disposed in a grid or lattice shape.

In an embodiment, the first protection portion may include a second region adjacent to the first region of the first protection portion. The second region of the first protection portion may have an elastic modulus that is greater than an elastic modulus of the first region of the first protection portion.

In an embodiment, the second region of the first protection portion may have a uniform thickness in the first direction.

In an embodiment, the first support layer and the second support layer may include stainless steel or invar.

In an embodiment, the cover layer may have an elastic modulus that is smaller than an elastic modulus of the first support layer.

In an embodiment, the cover layer may include a cushion layer including a foamed resin layer or a silicone resin layer.

In an embodiment, the cover layer may include a plastic resin layer disposed on a surface of the cushion layer.

In an embodiment, the cover layer may include a heat-dissipation layer disposed on a surface of the cushion layer, and the heat-dissipation layer may have thermal conductivity that is higher than a thermal conductivity of the cushion layer.

In an embodiment, the lower member may include a first adhesive layer attached to a top surface of the first support portion, and a second adhesive layer attached to a top surface of the second support portion. The first adhesive layer and the second adhesive layer may be spaced apart from each other in the first direction.

In an embodiment, in case that the display device in an unfolded state, a distance between the first adhesive layer and the second adhesive layer corresponds to a width of the folding region.

In an embodiment, the lower member may include a panel protection layer disposed between the display panel and the first support layer and between the display panel and the second support layer, and a cushion layer disposed between the panel protection layer and the first support layer and between the panel protection layer and the second support layer.

In an embodiment, the lower member may include a first adhesive layer attaching the first support portion to the cover layer and a second adhesive layer attaching the second support portion to the cover layer. The first adhesive layer and the second adhesive layer may be spaced apart from each other in the first direction.

In an embodiment, the cover layer may include a first cover region corresponding to the folding region and a second cover region corresponding to the first non-folding region. In case that the display panel is in an unfolded state, a distance between the first cover region and the display panel may be larger than a distance between the second cover region and the display panel.

In an embodiment, the cover layer may include a first cover region corresponding to the folding region and a second cover region corresponding to the first non-folding region. A distance between the first cover region and the display panel may be larger in case that the display panel is in an unfolded state than in case that the display panel is in a folded state.

In an embodiment, in case that the display panel is in the unfolded state, the first cover region of the cover layer may be spaced apart from the first protection portion of the first support layer. In case that the display panel is in the folded state, the first cover region of the cover layer may contact the first protection portion of the first support layer.

According to an embodiment, a display device may include a display panel and a lower member. The display panel may include a first non-folding region, a second non-folding region, and a folding region, which is disposed between the first non-folding region and the second non-folding region in a first direction. The lower member may be disposed below the display panel and may include a first support layer, a second support layer, and a cover layer. The first support layer may include a first support portion corresponding to the first non-folding region, and a first protection portion, extending from the first support portion and corresponding to the folding region. The second support layer may include a second support portion corresponding to the second non-folding region, and a second protection portion extending from the second support portion and corresponding to the folding region. The second support layer may be spaced apart from the first support layer. The cover layer may be disposed below and attached to the first support layer and the second support layer and may correspond to the first non-folding region, the second non-folding region, and the folding region. The first protection portion may include a first region including at least one of a first groove and a first opening, and a second region that does not include the first groove or the first opening. The second protection portion may include a first region including at least one of a second groove and a second opening, and a second region that does not include the second groove or the second opening. The second region of the first protection portion may be closer to the second region of the second protection portion than the first region of the first protection portion. The second region of the second protection portion may be closer to the second region of the first protection portion than the first region of the second protection portion.

In an embodiment, a third groove or a third opening may be disposed in a region of the first support portion adjacent to the first protection portion. A fourth groove or a fourth opening may be disposed in a region of the second support portion adjacent to the second protection portion.

BRIEF DESCRIPTION OF THE DRAWINGS

The above and other aspects and features of the disclosure will become more apparent by describing in detail embodiments thereof with reference to the attached drawings, in which:

FIG. 6C is an enlarged schematic sectional view illustrating a portion of a display device, in which the support layer of FIGS. 6A and 6B is provided.

Figure 1A:
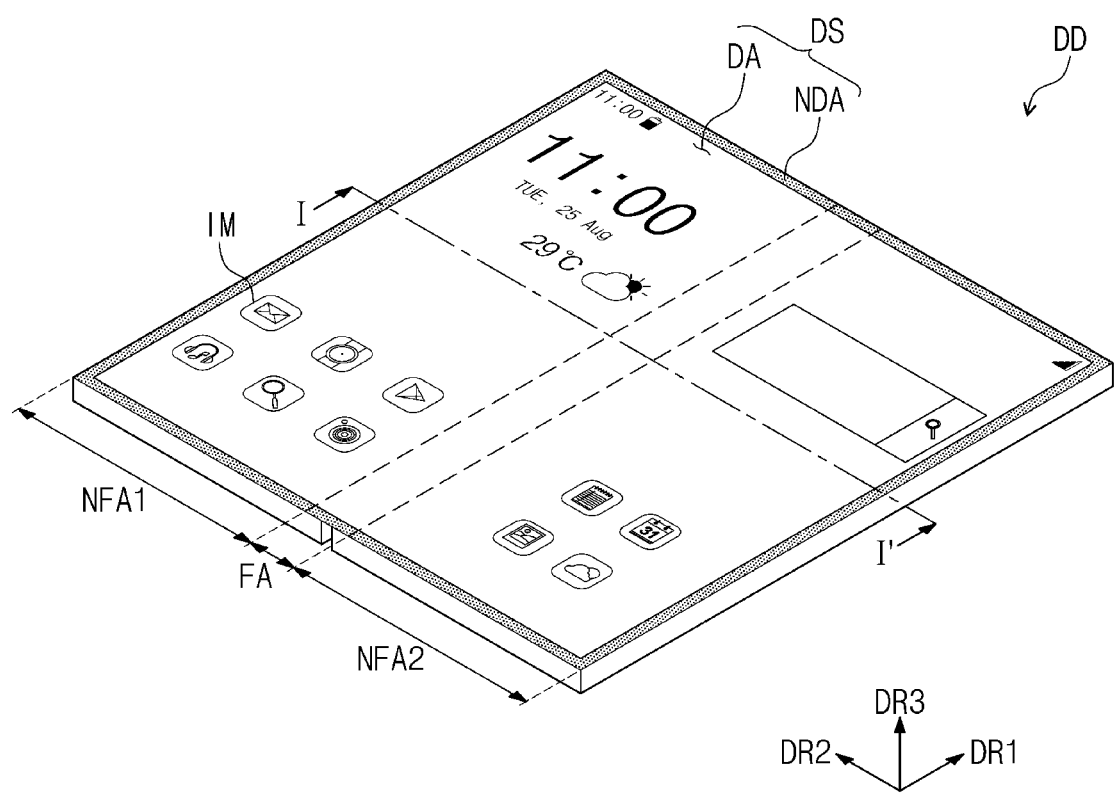
FIGS. 1A and 1B are schematic perspective views illustrating an electronic device according to an embodiment.

It should be noted that these figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by embodiments.

DETAILED DESCRIPTION OF THE EMBODIMENTS

The disclosure will now be described more fully with reference to the accompanying drawings, in which embodiments are shown. The disclosure may, however, be embodied in many different forms and should not be construed as being limited to the embodiments set forth herein; rather, these embodiments are provided so that this disclosure will be thorough and complete, and will fully convey the scope of disclosure to those of ordinary skill in the art.

In the drawings, sizes, thicknesses, ratios, and dimensions of the elements may be exaggerated for ease of description and for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer, or section discussed below could be termed a second element, component, region, layer, or section without departing from the teachings of embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing embodiments only and is not intended to be limiting of embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

In the specification, the expression "one region or portion corresponds to another region or portion" will be used to mean that they are overlapped with each other, but they do not have to be limited to the same area.

The embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, the embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
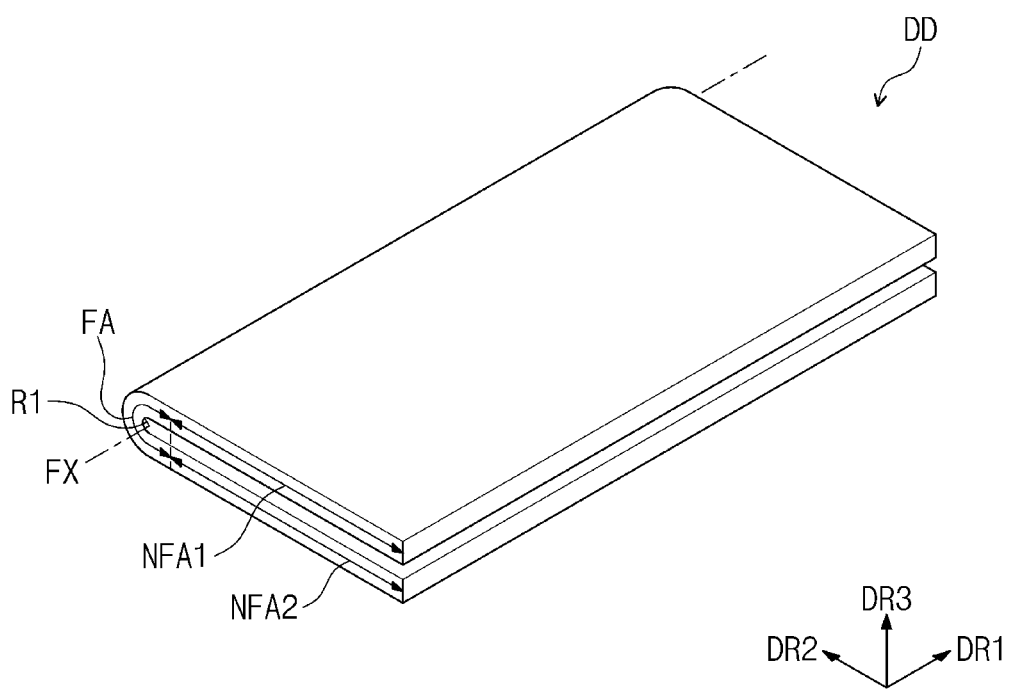

FIGS. 1A and 1B are schematic perspective views illustrating a display device DD according to an embodiment. FIG. 1A illustrates an unfolded state of the display device DD, and FIG. 1B illustrates a folded state of the display device DD.

Referring to FIGS. 1A and 1B, the display device DD may include a display surface DS, which is defined by two different directions (e.g., a first direction DR1 and a second direction DR2). The display device DD may provide an image IM to a user through the di splay surface DS.

The display surface DS may include a display region DA and a non-display region NDA around or near the display region DA. The display region DA may display the image IM, whereas the non-display region NDA may not be used to display the image IM. The non-display region NDA may enclose the display region DA. However, the embodiment is not limited thereto, and in an embodiment, the shape of the display region DA and the shape of the non-display region NDA may be variously changed.

Hereinafter, a direction perpendicular to both of the first and second directions DR1 and DR2 will be referred to as a third direction DR3. Furthermore, the expression "when viewed in a plan view" in the specification will be used to describe a structure viewed in the third direction DR3. Hereinafter, the first to third directions DR1, DR2, and DR3 may be directions indicated by first to third direction axes, respectively, and will be identified with the same reference numbers.

The display device DD may include a folding region FA, a first non-folding region NFA1, and a second non-folding region NFA2. In the second direction DR2, the folding region FA may be disposed between the first and second non-folding regions NFA1 and NFA2.

As shown in FIG. 1B, the folding region FA may be folded along a folding axis FX parallel to the first direction DR1. The folding region FA may have a curvature and a curvature radius R1. The display device DD may be folded in an inner-folding manner that the first non-folding region NFA1 faces the second non-folding region NFA2 and the display surface DS is not exposed to the outside.

In an embodiment, the display device DD may be folded in an outer-folding manner that the display surface DS is exposed to the outside. In an embodiment, the display device DD may repeat an unfolding operation and an inner- or outer-folding operation. In an embodiment, the display device DD may repeat the unfolding operation and the inner-folding operation or to repeat the unfolding operation and the outer-folding operation.

As shown in FIG. 1B, a distance between the first and second non-folding regions NFA1 and NFA2 may be substantially equal to two times the curvature radius R1, but the embodiments are not limited thereto. Although not shown, the distance between the first and second non-folding regions NFA1 and NFA2 may be smaller than two times the curvature radius R1. In an embodiment, the distance between the first and second non-folding regions NFA1 and NFA2 may decrease with increasing distance from the folding region FA.

Figure 2A:
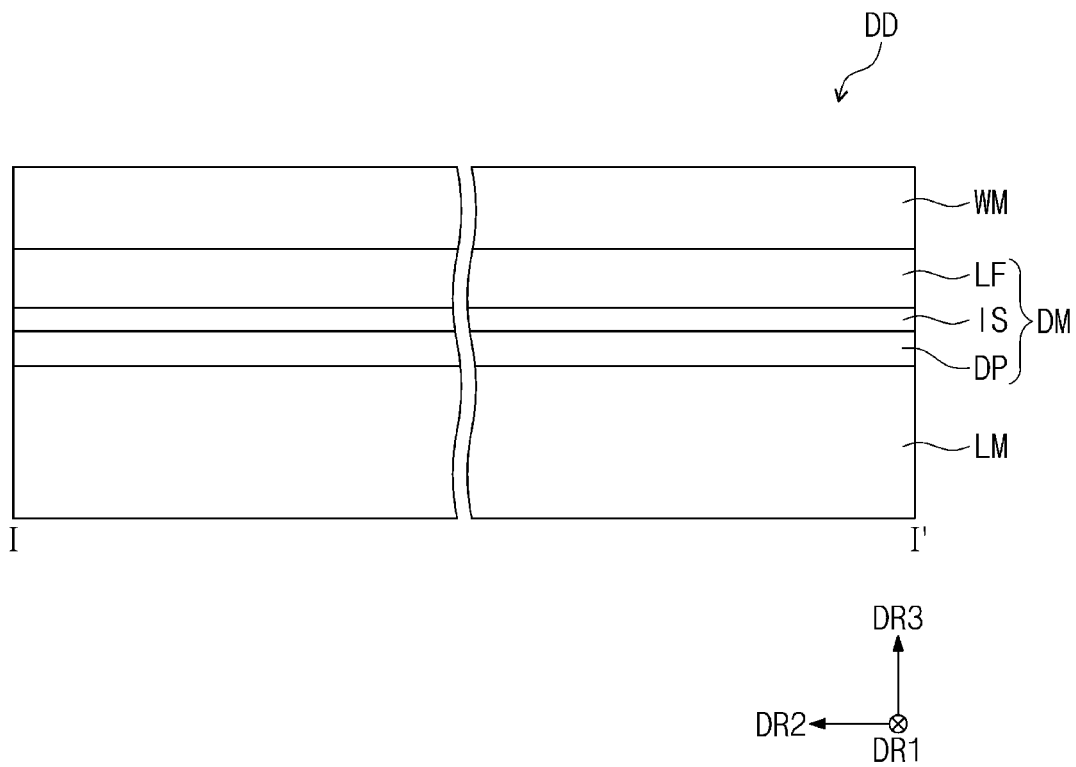
FIG. 2A is a sectional view schematically illustrating a display device according to an embodiment.
Figure 2B:
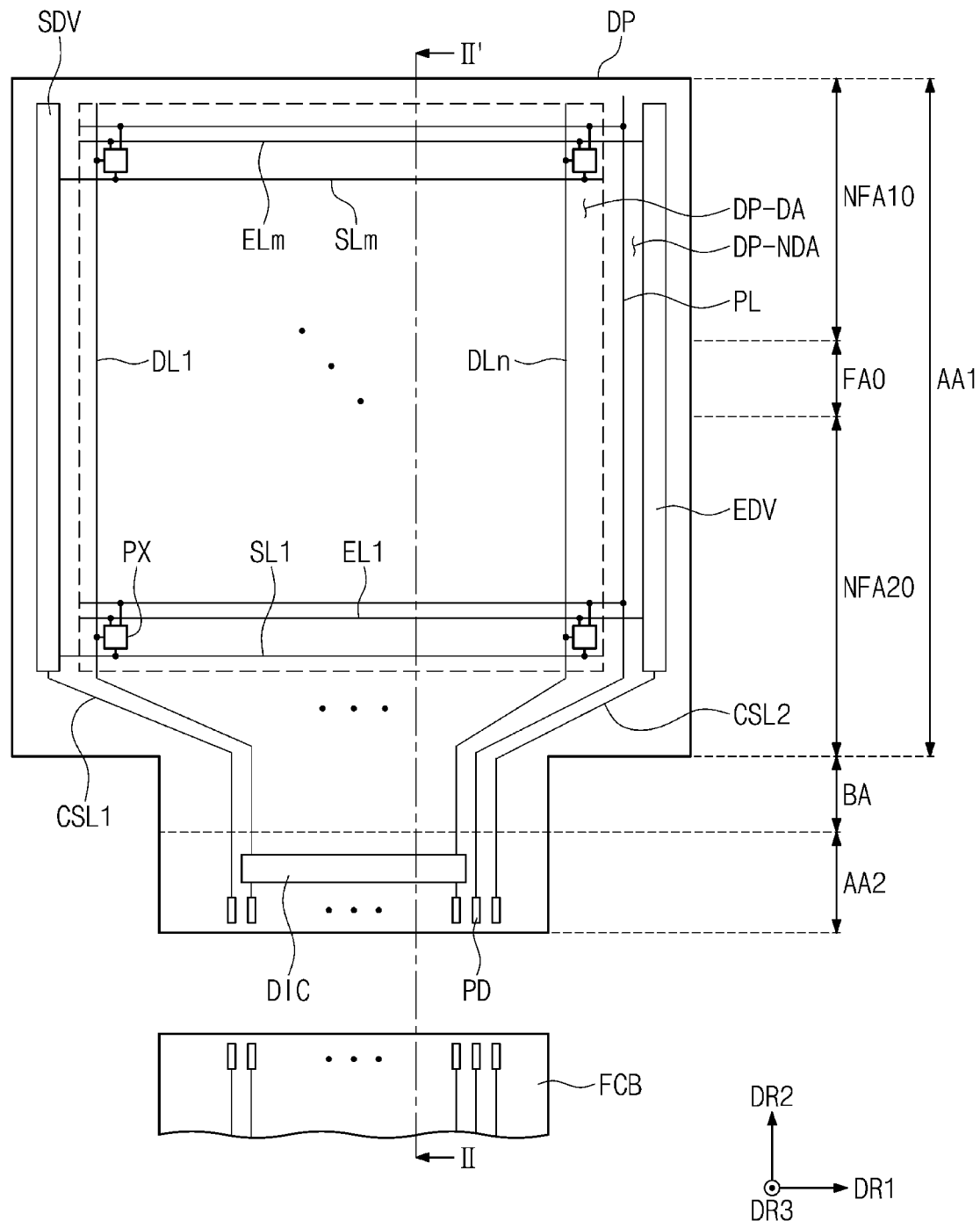
FIG. 2B is a schematic plan view illustrating a display panel according to an embodiment.

FIG. 2A is a sectional view schematically illustrating the display device DD according to an embodiment. FIG. 2B is a schematic plan view of a display panel DP according to an embodiment. FIG. 2A illustrates a cross-section taken along line I-I' of FIG. 1A.

As shown in FIG. 2A, the display device DD may include the display panel DP, an input sensor IS disposed on the display panel DP, an anti-reflection member LF disposed on the input sensor IS, a window module WM disposed on the anti-reflection member LF, and a lower member LM disposed below the display panel DP. If necessary, an adhesive layer may be disposed between the members.

The display panel DP may include a base layer, a circuit device layer disposed on the base layer, a display device layer disposed on the circuit device layer, and a thin encapsulation layer disposed on the display device layer. The base layer may include a plastic film. For example, the base layer may be formed of or include poly imide. When viewed in a plan view, the base layer may have substantially the same shape as the display panel DP of FIG. 2B.

The circuit device layer may include an organic layer, an inorganic layer, a semiconductor pattern, a conductive pattern, a signal line, and so forth. The organic layer, the inorganic layer, the semiconductor layer, and the conductive layer may be formed on the base layer by coating and deposition methods. Thereafter, photolithography processes may be performed to selectively pattern the organic layer, the inorganic layer, the semiconductor layer, and the conductive layer, and as a result, a semiconductor pattern, a conductive pattern, and a signal line may be formed.

The semiconductor pattern, the conductive pattern, and the signal line may be used as a pixel driving circuit of pixels PX (e.g., see FIG. 2B) and signal lines SL1-SLm, DL1-DLn, EL1-ELm, CSL1, CSL2, and PL, which will be described below. The pixel driving circuit may include at least one transistor.

The display device layer may include light-emitting elements of the pixels PX, which will be described below. The light-emitting element device may be electrically connected to the at least one transistor. The thin encapsulation layer may be disposed on the circuit device layer to seal the display device layer. The thin encapsulation layer may include an inorganic layer, an organic layer, and an inorganic layer, which are sequentially stacked. The thin encapsulation layer is not limited to a stacking structure.

The input sensor IS may include sensing electrodes (not shown) to sense an external input, trace lines (not shown) connected to the sensing electrodes, and an inorganic and/or organic layers to electrically separate and protect the sensing electrodes or the trace lines. The sensing electrodes may be overlapped with a display region DP-DA (e.g., see FIG. 2B). The input sensor IS may be a capacitance-sensing-type sensor, but the embodiment is not limited to thereto.

In the fabrication process of the display panel DP, the input sensor IS may be directly formed on the thin encapsulation layer through a successive process. However, the embodiment is not limited to thereto, and in an embodiment, the input sensor IS may be fabricated as a panel distinct from the display panel DP and may be attached to the display panel DP by an adhesive layer.

The anti-reflection member LF may reduce optical reflectance of light, which is incident from the outside. The anti-reflection member LF may include a phase retarder and/or a polarizer. The anti-reflection member LF may include at least one polarizing film. In an embodiment, the anti-reflection member LF may include a color filter and a black matrix. In the specification, the structure, in which the display panel DP, the input sensor IS, and the anti-reflection member LF are stacked, may be defined as a display module DM.

The lower member LM may include various functional members. For example, the lower member LM may include a light-blocking layer preventing light from being incident into the display panel DP, an impact absorbing layer absorbing an external impact, a support layer supporting the display panel DP, a heat-dissipation layer exhausting heat produced in the display panel DP, and so forth. However, the lower member LM is not limited to a stacking structure.

Referring to FIG. 2B, the display panel DP may include a display region DP-DA and a non-display region DP-NDA around or near the display region DP-DA. In an embodiment, the display region DP-DA or the non-display region DP-NDA may be determined depending on whether the presence or absence of the pixel PX. For example, the pixel PX may be disposed in the display region DP-DA.

The display panel DP may include the display region DP-DA and the non-display region DP-NDA corresponding to the display and non-display regions DA and NDA (e.g., see FIG. 1A) of the display device DD.

A scan driver SDV, a data driver, and an emission driver EDV may be disposed in the non-display region DP-NDA. The data driver may be a partial circuit constituting a driving chip DIC shown in FIG. 2B.

The display panel DP may include a first region AA1, a second region AA2, and a bending region BA, which are three different regions in the second direction DR2. The second region AA2 and the bending region BA may be a part of the non-display region DP-NDA. The bending region BA may be disposed between the first region AA1 and the second region AA2.

FIG. 2B illustrates the display panel DP in an unfolded state or before a bending operation. In the case where the display panel DP is provided as a part of an electronic device, the first and second regions AA1 and AA2 of the display panel DP may be disposed at different levels, even in case that the display device DD is in the unfolded state as shown in FIG. 1A. This is because the bending region BA is bent in such a way that the second region AA2 is disposed below the first region AA1.

The first region AA1 may be a region corresponding to the display surface DS of FIG. 1A. The first region AA1 may include a first non-folding region NFA10, a second non-folding region NFA20, and a folding region FA0. The first non-folding region NFA10, the second non-folding region NFA20, and the folding region FA0 may correspond to the first non-folding region NFA1, the second non-folding region NFA2, and the folding region FA of FIGS. 1A and 1B, respectively.

When measured in the first direction DR1, the bending region BA and the second region AA2 may be shorter than the first region AA1. The shorter a length of a region in a direction of a bending axis, the easier the bending operation.

The display panel DP may include pixels PX, scan lines SL1-SLm, data lines DL1-DLn, emission lines EL1-ELm, first and second control lines CSL1 and CSL2, a power line PL, and pads PD. Here, m and n are natural numbers. The pixels PX may be connected to the scan lines SL1-SLm, the data lines DL1-DLn, and the emission lines EL1-ELm.

The scan lines SL1-SLm may be extended in the first direction DR1 and may be connected to the scan driver SDV. The data lines DL1-DLn may be extended in the second direction DR2 and may be connected to the driving chip DIC via the bending region BA. The emission lines EL1-Elm may be extended in the first direction DR1 and may be connected to the emission driver EDV.

A portion of the power line PL extending in the second direction DR2 may be extended to the second region AA2 via the bending region BA. The power line PL may be used to a first voltage to the pixels PX. The first control line CSL1 may be connected to the scan driver SDV and may be extended to a lower portion of the second region AA2 via the bending region BA. The second control line CSL2 may be connected to the emission driver EDV and may be extended toward the lower portion of the second region AA2 via the bending region BA.

When viewed in a plan view, the pads PD may be disposed adjacent to the lower portion of the second region AA2. The driving chip DIC, the power line PL, the first control line CSL1, and the second control line CSL2 may be connected to the pads PD. A flexible circuit film FCB may be electrically connected to the pads PD through an anisotropic conductive adhesive layer.

FIG. 2B illustrates an example, in which the driving chip DIC is mounted on the display panel DP, but the embodiment is not limited to thereto. For example, the driving chip DIC may be mounted on the flexible circuit film FCB.

Figure 3A:
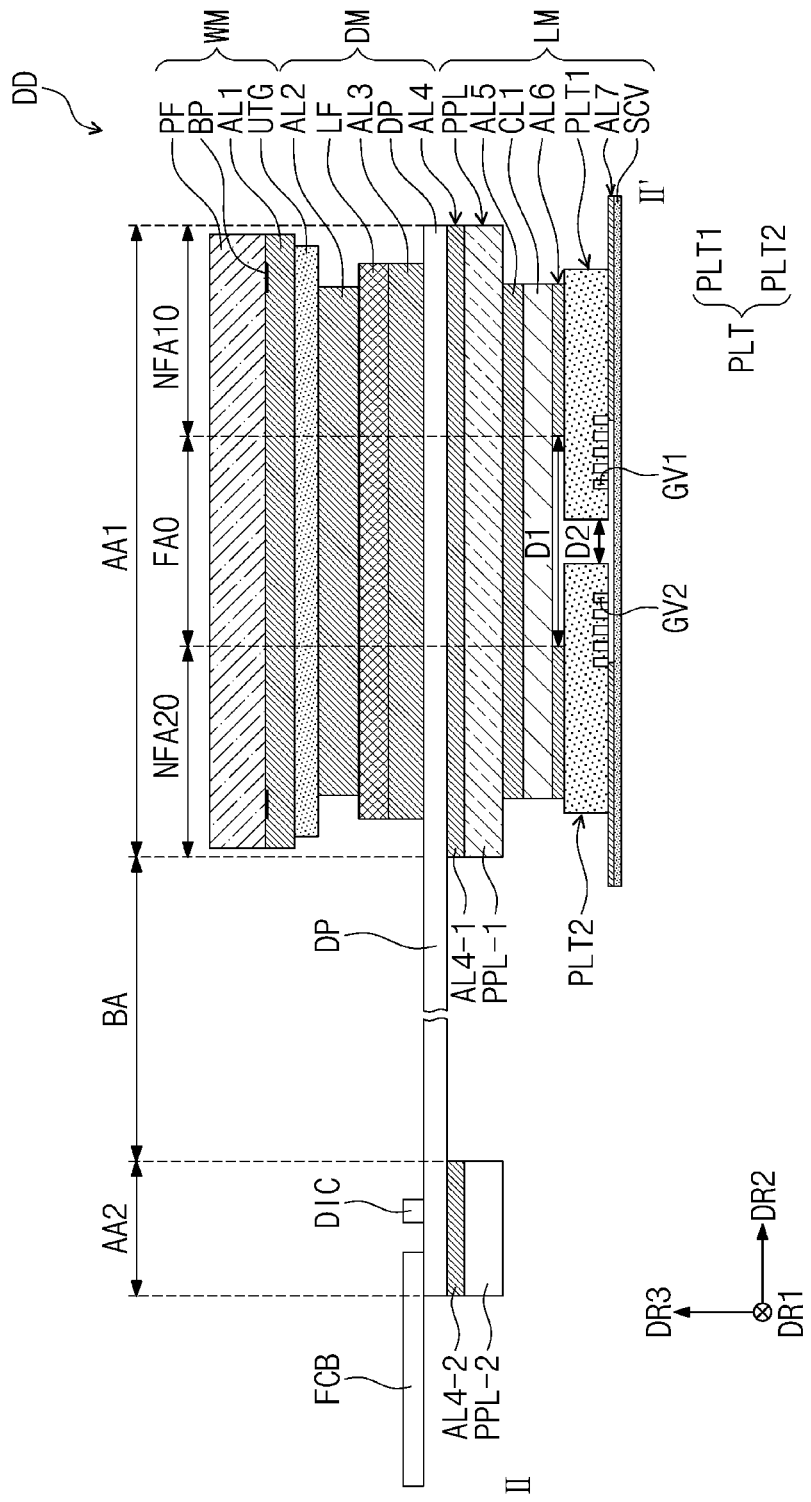
FIG. 3A is a schematic sectional view illustrating a display device according to an embodiment.
Figure 3B:
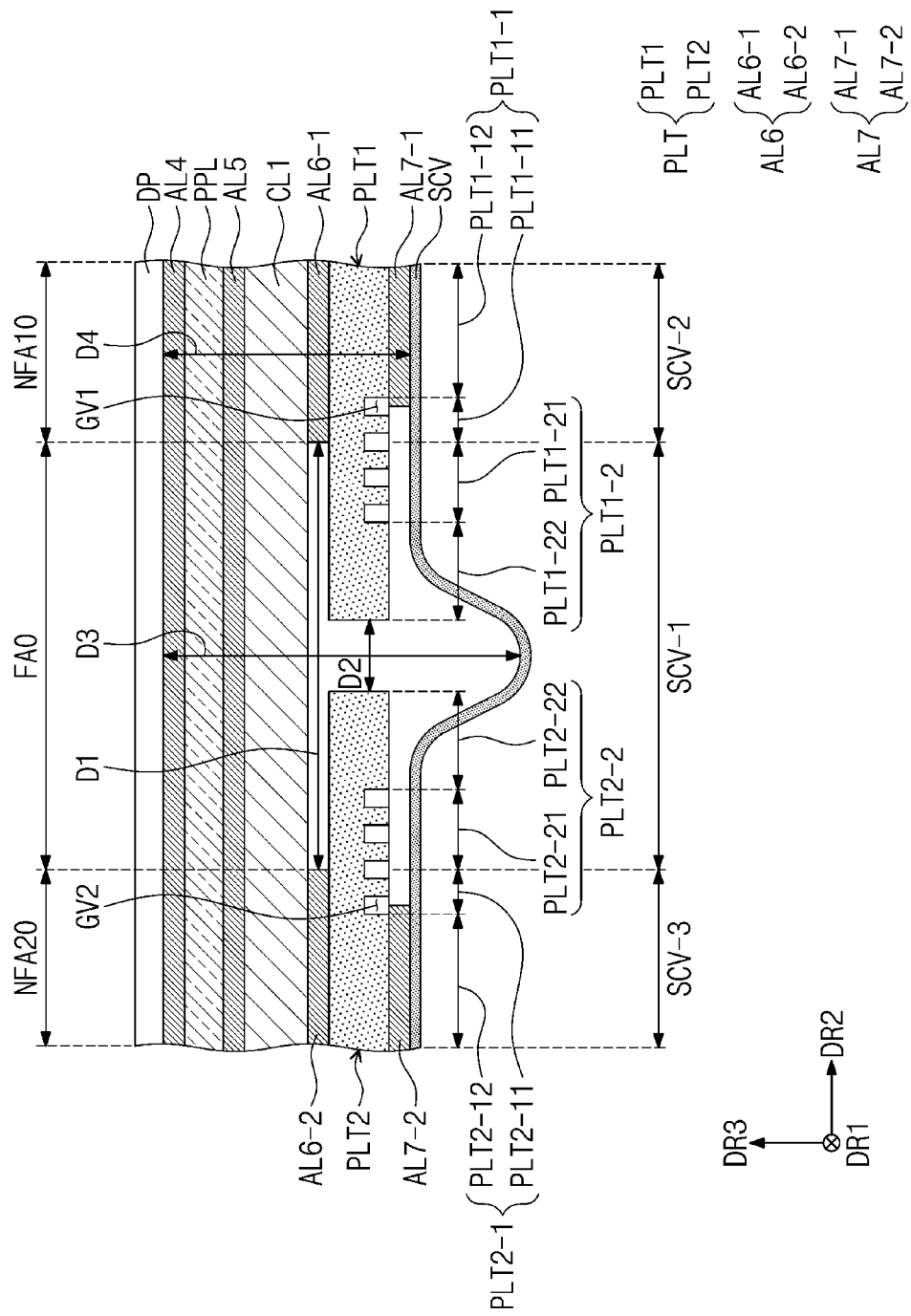
FIG. 3B is an enlarged schematic sectional view illustrating a portion of a display device in an unfolded state, according to an embodiment.
Figure 3C:
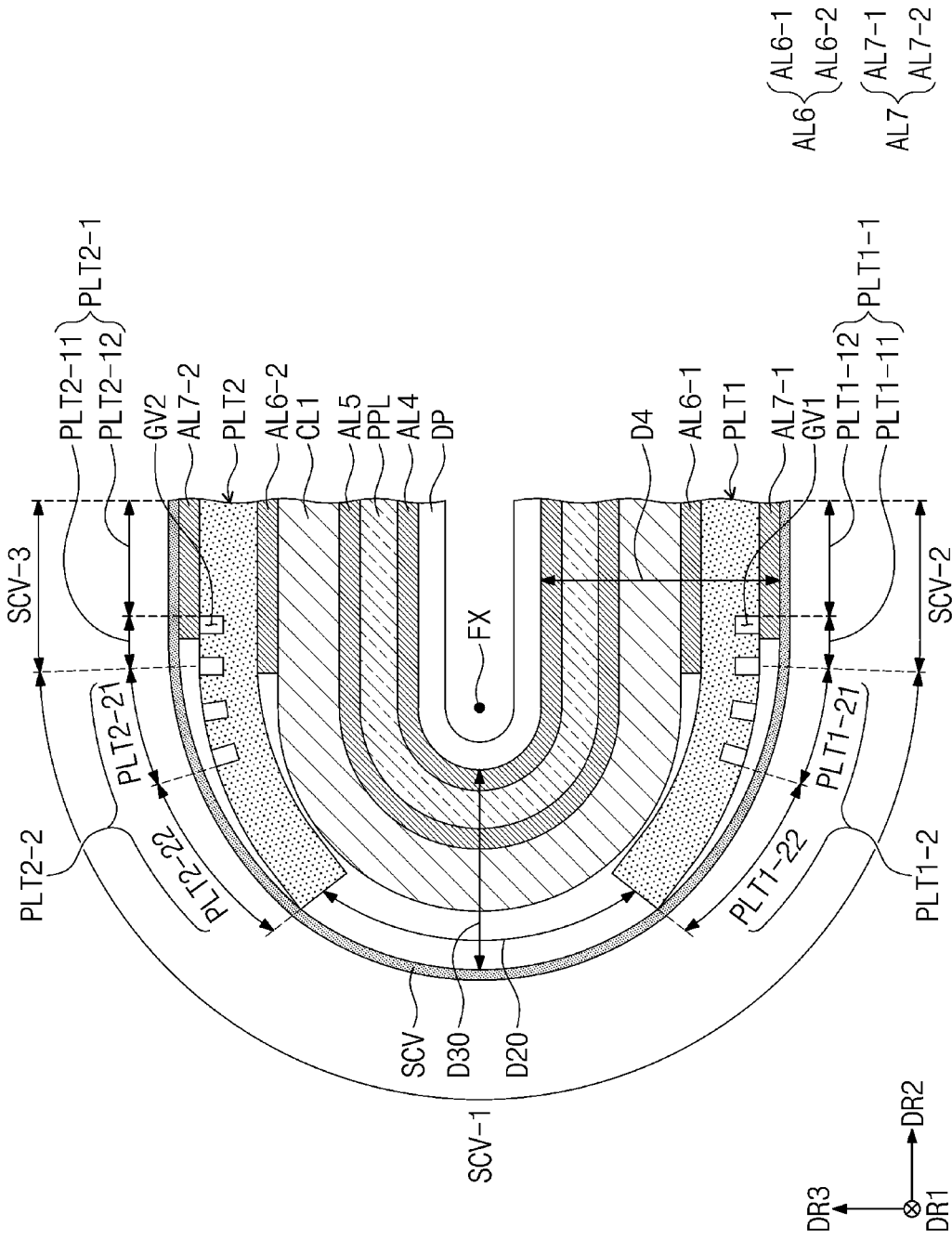
FIG. 3C is an enlarged schematic sectional view illustrating a portion of a display device in a folded state according to an embodiment.
Figure 4A:
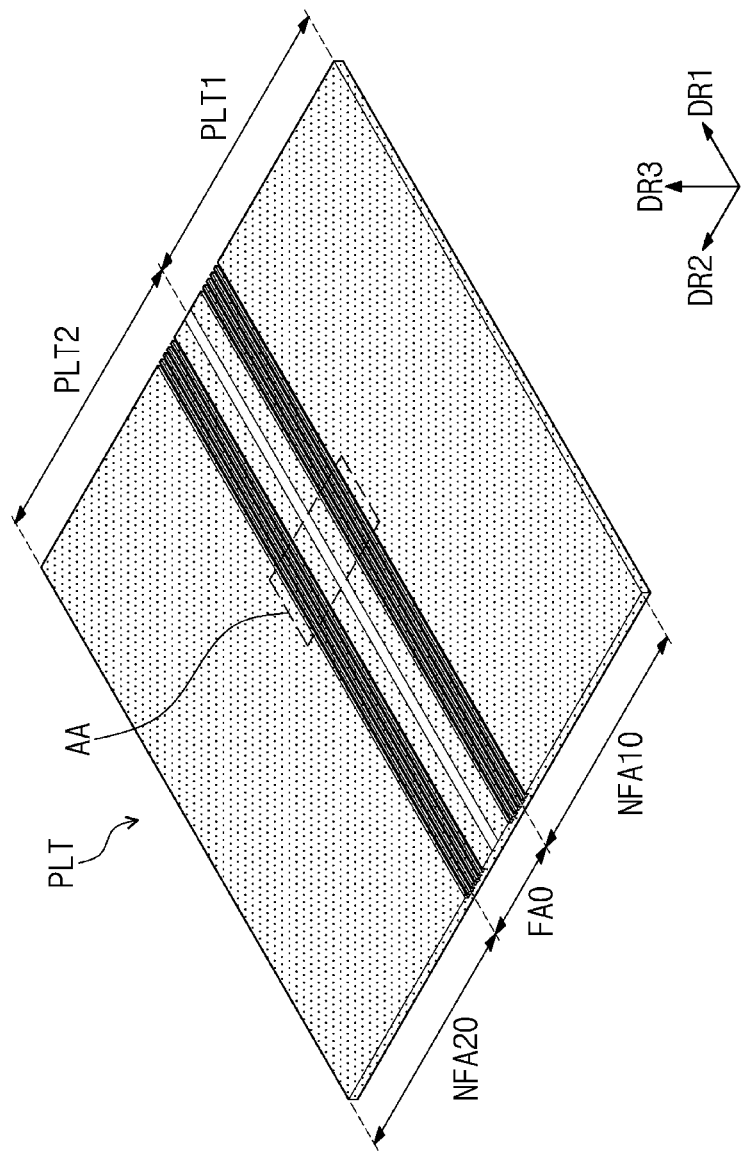
FIG. 4A is a schematic plan view illustrating a support layer according to an embodiment.
Figure 4B:
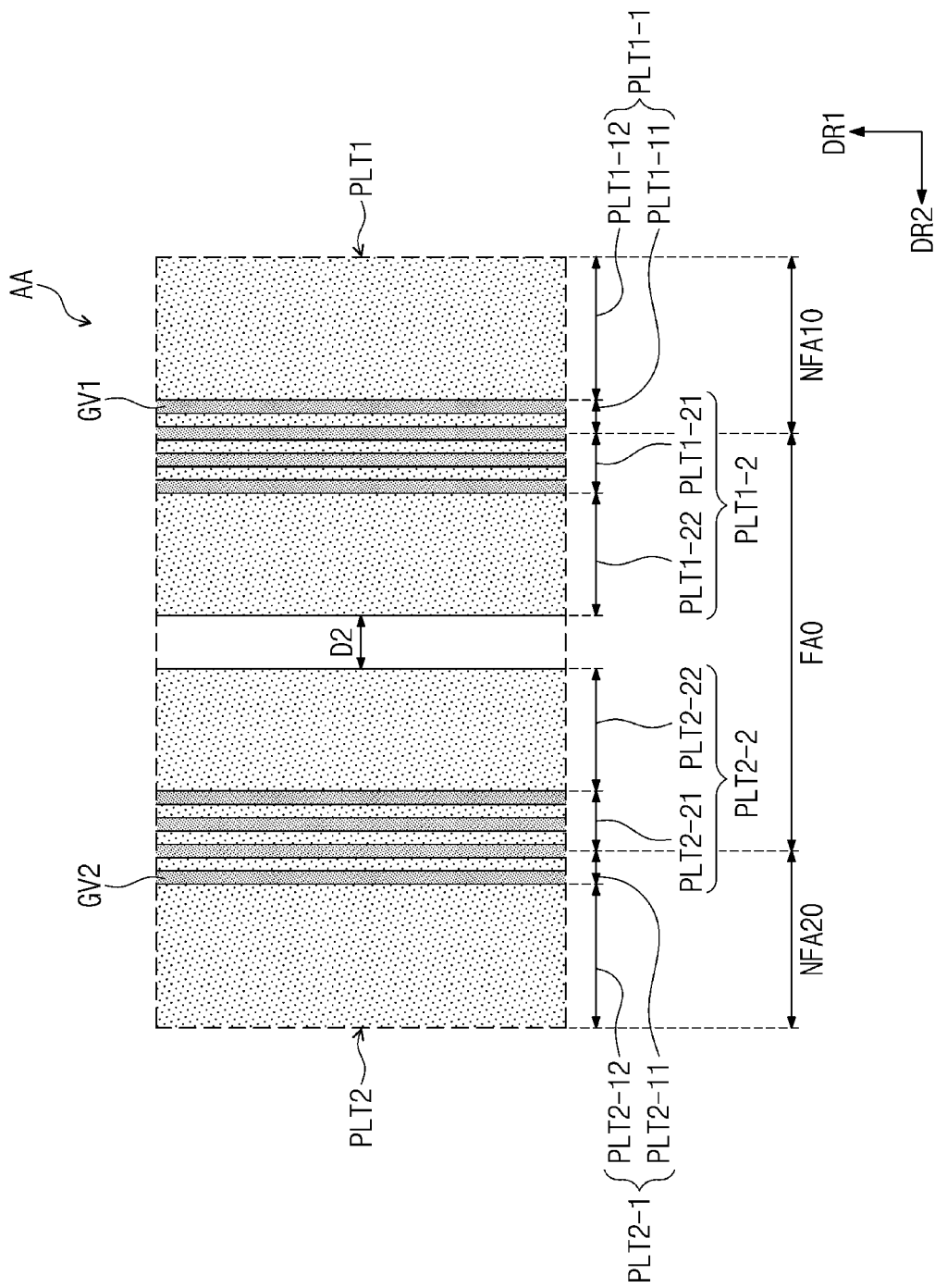
FIG. 4B is an enlarged schematic plan view illustrating a portion of the support layer of FIG. 4A.
Figure 4C:
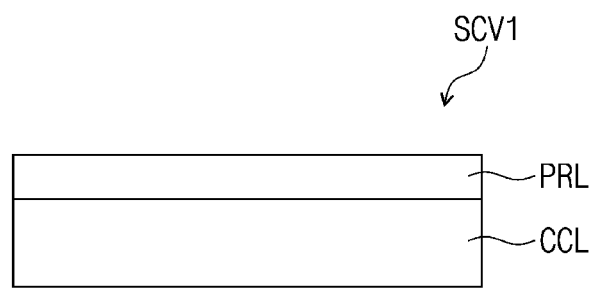
FIGS. 4C and 4D are schematic sectional views, which each illustrate a cover layer according to an embodiment.
Figure 4D:
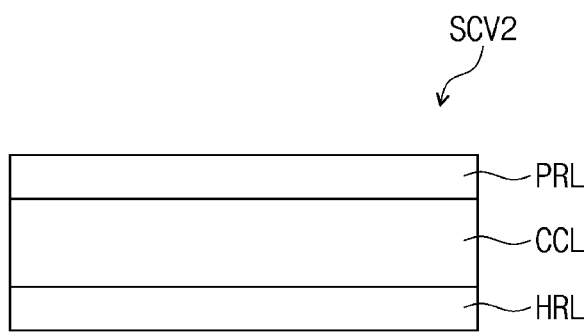

FIG. 3A is a schematic sectional view illustrating the display device DD according to an embodiment. FIG. 3A illustrates a cross-section taken along line II-II' of FIG. 2B. FIG. 3B is an enlarged schematic sectional view illustrating a portion of the display device DD in an unfolded state, according to an embodiment. FIG. 3C is an enlarged schematic sectional view illustrating a portion of the display device DD in a folded state according to an embodiment. FIG. 4A is a schematic plan view illustrating a support layer PLT according to an embodiment. FIG. 4B is an enlarged schematic plan view illustrating a portion of the support layer of FIG. 4A. FIGS. 4C and 4D are schematic sectional views, each of which illustrates a cover layer SCV according to an embodiment.

Hereinafter, the stacking structure of the display device DD according to an embodiment will be described in more detail with reference to FIGS. 3A to 3C. Referring to FIGS. 3A and 3B, the display device DD may include the window module WM, the display module DM, and the lower member LM. To avoid complexity in the drawings, the input sensor IS (refer to FIG. 2A) is omitted from FIG. 3A.

Referring to FIG. 3A, the window module WM may include a thin glass substrate UTG, a window protection layer PF disposed on the thin glass substrate UTG, and a bezel pattern BP. In the embodiment, the window protection layer PF may include a plastic film. The window module WM may further include an adhesive layer AL1 (hereinafter, a first adhesive layer) attaching the plastic film and the thin glass substrate UTG to each other. The bezel pattern BP may overlap the non-display region DP-NDA (e.g., see FIG. 2B). The bezel pattern BP may be disposed on a surface of the thin glass substrate UTG or on a surface of the window protection layer PF. FIG. 3A illustrates an example, in which the bezel pattern BP is disposed on a bottom surface of the window protection layer PF. However, the embodiment is not limited to thereto, and in an embodiment, the bezel pattern BP may be disposed on a top surface of the window protection layer PF. The bezel pattern BP may be a colored light-blocking layer, which is formed by, for example, a coating or deposition method. The bezel pattern BP may include a base material, in which a dye or pigment material is mixed.

The thin glass substrate UTG may have a thickness of about 15 μm to about 45 μm. The thin glass substrate UTG may be a chemical strengthening glass. By using the thin glass substrate UTG, it may be possible to suppress occurrence of a crease, even in case that the folding and unfolding operations are repeatedly performed.

The window protection layer PF may have a thickness of about 50 μm to about 80 μm. The window protection layer PF may be formed of or include at least one of polyimide, polycarbonate, polyamide, triacetylcellulose, polymethylmethacrylates, and polyethylene terephthalate. Although not shown, at least one of a hard coating layer, an anti-fingerprint layer, and an anti-reflection layer may be disposed on the top surface of the window protection layer PF.

The first adhesive layer AL1 may be a pressure sensitive adhesive (PSA) film or an optically clear adhesive (OCA) member. As will be described below, the display device DD may further include second to seventh adhesive layers AL2 to AL7, and here, each or at least one of the second to seventh adhesive layers AL2 to AL7 may be or include at least one of a pressure sensitive adhesive (PSA) film, an optically clear adhesive (OCA) member, and conventional adhesive agents.

The first adhesive layer AL1 may be detached from the thin glass substrate UTG. Since the window protection layer PF has rigidity lower than the thin glass substrate UTG, a scratch may easily occur on the window protection layer PF. The first adhesive layer AL1 and the window protection layer PF may be detached from the thin glass substrate UTG, and a new window protection layer PF may be attached to the thin glass substrate UTG.

The display module DM may be disposed below the window module WM. The display module DM may include the anti-reflection member LF and the display panel DP. Since the display panel DP was described with reference to FIGS. 2A and 2B, a detailed description of the display panel DP will not be repeated.

The anti-reflection member LF may be disposed in the first region AA1, as shown in FIG. 3A. The anti-reflection member LF may over at least display region DP-DA (e.g., see FIG. 2B). The second adhesive layer AL2 may attach the anti-reflection member LF to the window module WM, and the third adhesive layer AL3 may attach the anti-reflection member LF to the display panel DP.

The lower member LM may be disposed below the display module DM. The lower member LM may include a panel protection layer PPL, a first cushion layer CL1, the support layer PLT, and the cover layer SCV. In an embodiment, some of the above elements may be omitted from the lower member LM or at least one other element may be included in the lower member LM. For example, the first cushion layer CL1 may be omitted. The display device DD may further include a heat-dissipation layer.

The panel protection layer PPL may be disposed below the display panel DP and may be an element that is most adjacent to the display panel DP. The panel protection layer PPL may protect the display panel DP from any attach or impact, which may be exerted on the bottom surface of the display panel DP. The panel protection layer PPL may be formed of or include a flexible plastic material. For example, the panel protection layer PPL may be formed of or include polyethylene terephthalate. In an embodiment, the panel protection layer PPL may not be disposed in the folding region FAO.

In the embodiment, the panel protection layer PPL may include a first panel protection layer PPL-1 protecting the first region AA1 of the display panel DP and a second panel protection layer PPL-2 protecting the second region AA2.

The fourth adhesive layer AL4 may attach the panel protection layer PPL to the display panel DP. The fourth adhesive layer AL4 may include a first portion AL4-1 corresponding to the first panel protection layer PPL-1 and a second portion AL4-2 corresponding to the second panel protection layer PPL-2. In the case where the bending region BA is bent, the second panel protection layer PPL-2, along with the second region AA2, may be disposed below the first panel protection layer PPL-1. Since the panel protection layer PPL is not disposed in the bending region BA, the bending region BA may be more easily bent. The bending region BA may have a curvature or a curvature radius. The curvature radius may range from about 0.1 mm to about 0.5 mm.

The fifth adhesive layer AL5 may attach the panel protection layer PPL to the first cushion layer CL1. The first cushion layer CL1 may be disposed below the panel protection layer PPL.

The first cushion layer CL1 may absorb an external impact, which may be exerted on the display panel DP, and may prevent the display panel DP from being damaged by the external impact. The first cushion layer CL1 may be a layer having an elastic property and may be formed of or include a foamed resin, a sponge, or polyurethane. The first cushion layer CL1 may have a color, and it may be possible to prevent elements, which are disposed below the first cushion layer CL1, from being recognized by a user in case that the user watches the display device DD through the window module WM. The first cushion layer CL1 may be formed of or include at least one light-absorbing material.

The sixth adhesive layer AL6 may attach a bottom surface of the first cushion layer CL1 to a top surface of the support layer PLT. As shown in FIG. 3B, the sixth adhesive layer AL6 may include a first portion AL6-1 and a second portion AL6-2, which are spaced apart from each other. A distance D1 (hereinafter, a first distance) between the first and second portions AL6-1 and AL6-2 may correspond to a width of the folding region FAO. In an embodiment, the first distance D1 may be substantially same as the width of the folding region FAO. The first distance D1 may range from about 7 mm to about 15 mm, for example, about 9 mm to about 13 mm.

Since the sixth adhesive layer AL6 may not overlap a portion of the support layer PLT, a portion of the support layer PLT whose width is given by the first distance D1 may not be attached to the first cushion layer CL1. Thus, a stress of the support layer PLT, which is produced in the folded state shown in FIG. 3C, may not be transferred to a member placed on the first cushion layer CL1. Thus, it may be possible to reduce a stress, which is exerted on the folding region FAO of the display and window modules DM and WM in the folded state.

In the embodiment, the first and second portions AL6-1 and AL6-2 of the sixth adhesive layer AL6 may be defined as different portions of a single adhesive layer, but the embodiment is not limited to this definition. The first portion AL6-1 may be defined as an adhesive layer (e.g., a first adhesive layer), whereas the second portion AL6-2 may be defined as another adhesive layer (e.g., a second adhesive layer).

In the embodiment, an intermediate layer, which is disposed between the display panel DP and the support layer PLT, is described to include the panel protection layer PPL and the first cushion layer CL1, but the structure of the intermediate layer is not limited thereto. The first cushion layer CL1 is illustrated to contact the sixth adhesive layer AL6, but the embodiment is not limited thereto. In an embodiment, a plastic film may be further disposed between the first cushion layer CL1 and the sixth adhesive layer AL6, and here, the plastic film may be attached to the sixth adhesive layer AL6.

The support layer PLT may support elements, which are disposed on the support layer PLT, and may maintain the unfolded or folded state of the display device DD. The support layer PLT may include a first support layer PLT1 and a second support layer PLT2.

As shown in FIGS. 3B, 4A, and 4B, in case that the display device DD is in the unfolded state, the first and second support layers PLT1 and PLT2 may be spaced apart from each other. However, in an embodiment, the first and second support layers PLT1 and PLT2 may not be spaced apart from each other, and a side surface of the first support layer PLT1 contact a side surface of the second support layer PLT2. The first and second support layers PLT1 and PLT2 may be disposed to be spaced apart from each other by a distance D2 (hereinafter, a second distance), in consideration of a process error, and it may be possible to prevent the first and second support layers PLT1 and PLT2 from being interfered with each other in a process of disposing the first and second support layers PLT1 and PLT2 side by side. The second distance D2 may be equal to or smaller than about 0.7 mm.

The first support layer PLT1 may include a first support portion PLT1-1, which corresponds to the first non-folding region NFA10, and a first protection portion PLT1-2, which is extended from the first support portion PLT1-1. The first protection portion PLT1-2 may correspond to a portion of the folding region FAO. The second support layer PLT2 may include a second support portion PLT2-1, which corresponds to the second non-folding region NFA20, and a second protection portion PLT2-2, which is extended from the second support portion PLT2-1. The second protection portion PLT2-2 may correspond to a portion of the folding region FAO.

At least one of a first groove and a first opening may be defined in the first support layer PLT1, and at least one of a second groove and a second opening may be defined in the second support layer PLT2. The description that follows will refer to an example of the embodiment in which first grooves GV1 are formed in a bottom surface of the first support layer PLT1 and second grooves GV2 are formed in a bottom surface of the second support layer PLT2. Hereinafter, the arrangement of the grooves GV1 and GV2 will be described in more detail with reference to the first support layer PLT1. The second support layer PLT2 or the grooves therein may have substantially the same features as those in the first support layer PLT1 to be described below.

Some of the first grooves GV1 may be located in a first region PLT1-11 of the first support portion PLT1-1 adjacent to the first protection portion PLT1-2, and some of the first grooves GV1 may be located in a first region PLT1-21 of the first protection portion PLT1-2 adjacent to the first support portion PLT1-1. In an embodiment, at least one of the first grooves GV1 may overlap both of the first region PLT1-11 of the first support portion PLT1-1 and the first region PLT1-21 of the first protection portion PLT1-2.

Another region of the first support portion PLT1-1, in which the first grooves GV1 are not formed, may be defined as a second region PLT1-12, and another region of the first protection portion PLT1-2, in which the first grooves GV1 are not formed, may be defined as a second region PLT1-22. Similarly, the second support portion PLT2-1 may include a first region PLT2-11 and a second region PLT2-12, and the second protection portion PLT2-2 may include a first region PLT2-21 and a second region PLT2-22.

The second region PLT1-12 of the first support portion PLT1-1 and the second region PLT1-22 of the first protection portion PLT1-2 may have a uniform thickness in the second direction DR2. The second region PLT2-12 of the second support portion PLT2-1 and the second region PLT2-22 of the second protection portion PLT2-2 may also have a uniform thickness in the second direction DR2.

The first grooves GV1 may be successively disposed from the first region PLT1-11 of the first support portion PLT1-1 to the first region PLT1-21 of the first protection portion PLT1-2. In the second direction DR2, the first grooves GV1 may be spaced apart from each other by the same distance. In the second direction DR2, widths of the first grooves GV1 may be the same but the embodiments are not limited thereto.

The first and second support layers PLT1 and PLT2 may be formed of or include at least one of SUS (stainless steel), invar, aluminum alloys, magnesium alloys, copper alloys, and titanium alloys, but the embodiment is not limited thereto. For example, the first and second support layers PLT1 and PLT2 may include various metallic materials. The first support portion PLT1-1 and the first protection portion PLT1-2 may be provided as a single object and may be formed of or include a same material.

Referring to FIG. 3B, the seventh adhesive layer AL7 may attach the support layer PLT to the cover layer SCV. The seventh adhesive layer AL7 may include a first portion AL7-1 and a second portion AL7-2, which are spaced apart from each other. The first and second portions AL7-1 and AL7-2 may correspond to the first and second support layers PLT1 and PLT2, respectively. A distance between the first and second portions AL7-1 and AL7-2 of the seventh adhesive layer AL7 may correspond to the first distance D1 described above. In an embodiment, the distance between the first and second portions AL7-1 and AL7-2 of the seventh adhesive layer AL7 may be larger than the first distance D1.

The cover layer SCV may be attached to the first and second support layers PLT1 and PLT2, may correspond to the first non-folding region NFA10, the second non-folding region NFA20, and the folding region FAO, and may overlap the first and second grooves GV1 and GV2 defined in the support layer PLT.

The cover layer SCV may have an elastic modulus that is lower than the support layer PLT. The cover layer SCV may have a thickness of about 100 μm or less and may have an elastic modulus of about 100 MPa or lower. As an example, the cover layer SCV may have the same structure as a mesh filter. As an example, the cover layer SCV may include a plastic film. The cover layer SCV may include a cushion layer, such as a foamed resin layer or a silicone resin layer.

Even in case that, as shown in the folded state of FIG. 3C, an empty space between the first and second support layers PLT1 and PLT2 is expanded by the folding operation, the cover layer SCV may prevent contaminants from passing through the expanded empty space.

Although not illustrated in the drawings, a hinge structure may be disposed below the cover layer SCV to physically or stably maintain or change the folding state of the display device DD (for example, from the unfolded state to the folded state or vice versa).

Referring to FIG. 4C, a cover layer SCV1 may further include a plastic resin layer PRL, which is disposed on a top surface of a cushion layer CCL. The plastic resin layer PRL may reduce a tear failure in the cover layer SCV1. The plastic resin layer PRL may be formed by forming a PET or PI resin on the top surface of the cushion layer CCL by a spin coating or slit coating method.

Referring to FIG. 4D, a cover layer SCV2 may further include a heat-dissipation layer HRL, which is disposed on a bottom surface of the cushion layer CCL. The heat-dissipation layer HRL may have thermal conductivity that is higher than the cushion layer CCL. The heat-dissipation layer HRL may radiate heat produced from electronic components disposed below the cover layer SCV2. The heat-dissipation layer HRL may be formed of or include graphite. The heat-dissipation layer HRL may not be disposed in the folding region FAO (e.g., see FIG. 3B). The electronic component may include the flexible circuit film FCB (e.g., see FIG. 2B) or the driving chip DIC (e.g., see FIG. 2B) mounted on the flexible circuit film FCB.

Changes in relative positions of elements, which are caused by a change in shape of the display device DD from the unfolded state to the folded state, will be described in more detail with reference to FIGS. 3B and 3C. The first support layer PLT1 will be described to avoid repetition.

As shown in FIGS. 3B and 3C, the cover layer SCV may include a first cover region SCV-1 corresponding to the folding region FAO, a second cover region SCV-2 corresponding to the first non-folding region NFA10, and a third cover region SCV-3 corresponding to the second non-folding region NFA20.

As shown in FIG. 3B, in case that the display device DD is in an unfolded state, the first cover region SCV-1 and the display panel DP may be spaced apart from each other by a third distance D3. The third distance D3 may be measured in a region, in which the first and second support layers PLT1 and PLT2 are spaced apart from each other. In case that the display device DD in the unfolded state, the second cover region SCV-2 and the display panel DP may be spaced apart from each other by a fourth distance D4 smaller than the third distance D3.

As the state of the display device DD is changed from the unfolded state to the folded state as shown in FIG. 3C, the second distance D2 may be increased and the third distance D3 may be decreased. The fourth distance D4 may not change when the state of the display device DD is changed from the unfolded state to the folded state. A changed second distance D20, a changed third distance D30, and the fourth distance D4, which is not changed, are illustrated in FIG. 3C.

As the state of the display device DD is changed from the unfolded state to the folded state, the cover layer SCV may be stretched. The cover layer SCV, which is stretched by the change in the shape of the display device DD, may contact the first and second protection portions PLT1-2 and PLT2-2 which are adjacent to the folding axis FX. Due to its restoring force, the cover layer SCV may be deformed in such a way to reduce the stretched portion, although the cover layer SCV is stretched, and thus, the cover layer SCV may contact the first and second protection portions PLT1-2 and PLT2-2. In case that the display device DD is in the folded state, a center region of the first cover region SCV-1 may have the largest curvature radius in the first cover region SCV-1. In case that the display device DD is in the folded state, a region of the first cover region SCV-1, which contacts the first protection portion PLT1-2, may have a curvature radius that is smaller than the center region of the cover layer SCV.

The cover layer SCV may exert compressive stress on the first and second support layers PLT1 and PLT2, and this may lead to deformation of the first and second support layers PLT1 and PLT2 spaced apart from each other. A region, in which the grooves GV1 and GV2 are formed, may have an elastic modulus smaller than other regions and thus may be deformed by the exerted compressive stress. As the display device DD is folded, the first region PLT1-21 of the first protection portion PLT1-2 and the first region PLT2-21 of the second protection portion PLT2-2 may be bent.

Although the first grooves GV1 and the second grooves GV2 are respectively formed in the first region PLT1-11 of the first support portion PLT1-1 and the first region PLT2-11 of the second support portion PLT2-1, the first and second support portions PLT1-1 and PLT2-1 may be hardly or just slightly deformed, because they are combined to the first cushion layer CL1 by the sixth adhesive layer AL6. The first grooves GV1 and the second grooves GV2, which are formed in the first region PLT1-11 of the first support portion PLT1-1 and the first region PLT2-11 of the second support portion PLT2-1, may prevent the first region PLT1-21 of the first protection portion PLT1-2 and the first region PLT2-21 of the second protection portion PLT2-2 from being abruptly bent and may distribute the stress exerted, thereby allowing the bending operation to be gradually executed.

The second region PLT1-22 of the first protection portion PLT1-2 and the second region PLT2-22 of the second protection portion PLT2-2 may have a relatively high elastic modulus, and they may maintain the shape, on which the folding operation is not performed (the unfolded shape), even when the display device DD is folded. Even when the state of the display device DD is repeatedly changed from the unfolded state of FIG. 3B to the folded state of FIG. 3C, a large extent of deformation may not occur in the second region PLT1-22 of the first protection portion PLT1-2 and the second region PLT2-22 of the second protection portion PLT2-2, and thus, the first and second protection portions PLT1-2 and PLT2-2 may effectively support a structure, in the unfolded state. The first and second protection portions PLT1-2 and PLT2-2 may not cause the crease issue in the display device DD.

If the first and second grooves GV1 and GV2 are not formed in the first and second protection portions PLT1-2 and PLT2-2, the first and second protection portions PLT1-2 and PLT2-2 may maintain the same plane as the first support portion PLT1-1 and the second support portion PLT2-1, as shown in FIG. 3B, regardless of a change in shape of the display device DD (without bending). In the case where the first and second grooves GV1 and GV2 are not formed, the first and second protection portions PLT1-2 and PLT2-2, which have a stretchable property, and the cover layer SCV, which causes deformation of the first and second protection portions PLT1-2 and PLT2-2, may exert a large magnitude of stress on each other. The stress may be concentrated on a portion of the cover layer SCV, which contacts end portions of the first and second protection portions PLT1-2 and PLT2-2, and this may lead to the tear failure of the cover layer SCV.

By contrast, according to the embodiment, since the first region PLT1-21 of the first protection portion PLT1-2 and the first region PLT2-21 of the second protection portion PLT2-2 are bendable, it may reduce the stress exerted on the portions of the cover layer SCV that contact the end portions of the first and second protection portions PLT1-2 and PLT2-2. Thus, it may be possible to prevent the tear failure of the cover layer SCV caused by the first and second protection portions PLT1-2 and PLT2-2.

Figure 5A:
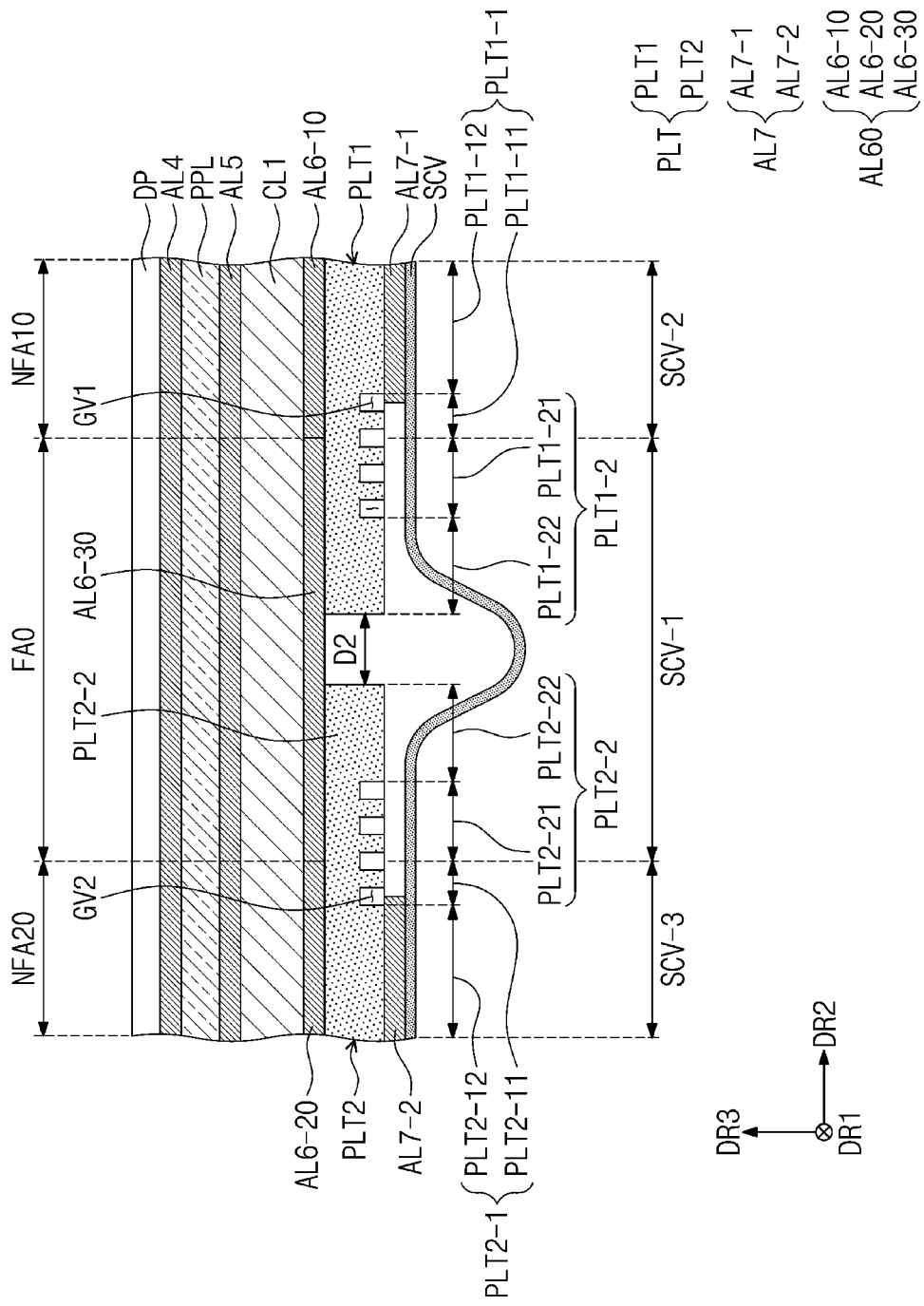
FIGS. 5A and 5B are enlarged schematic sectional views illustrating a portion of a display device according to an embodiment.
Figure 5B:
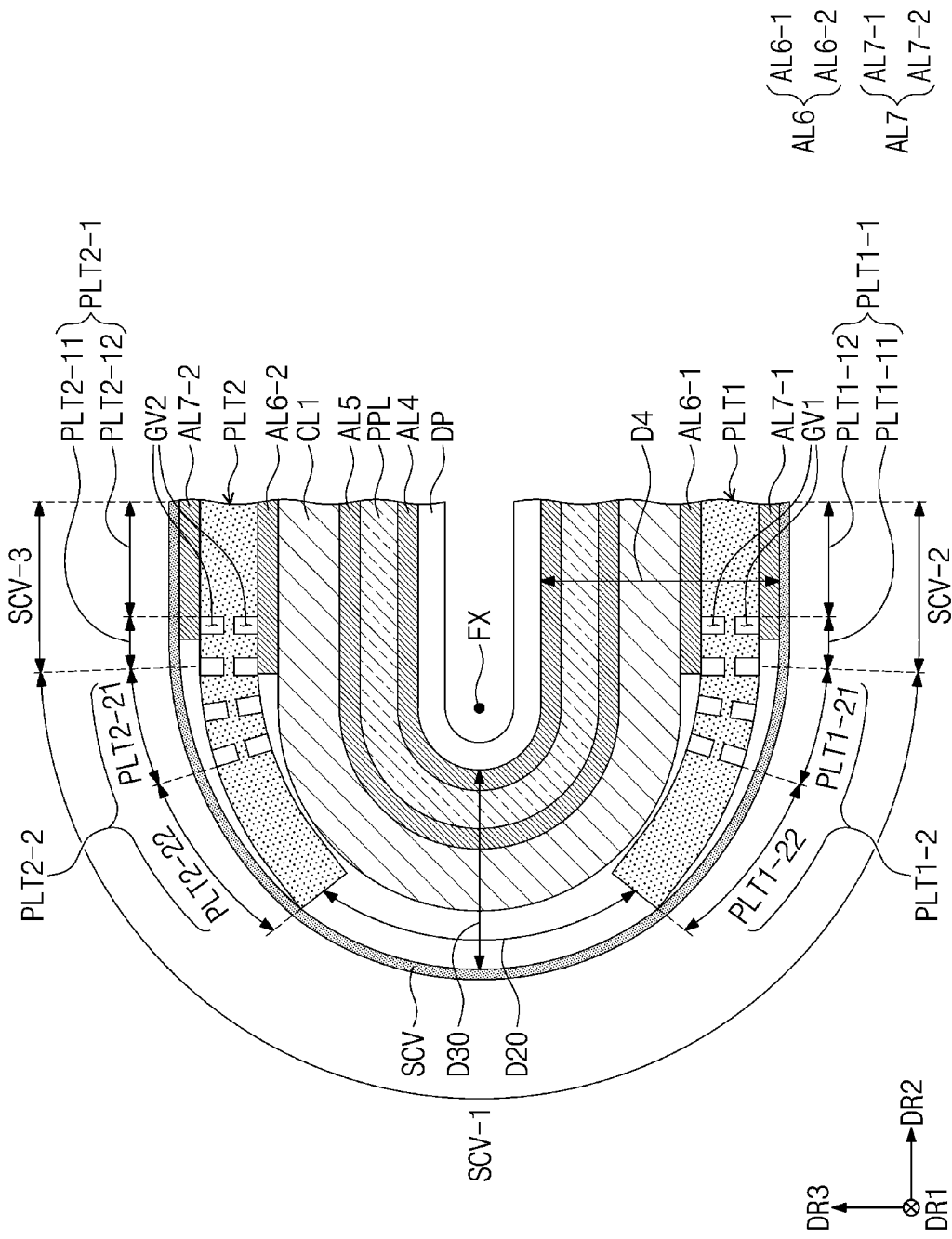

FIGS. 5A and 5B are enlarged schematic sectional views illustrating a portion of the display device DD according to an embodiment. FIG. 5A corresponds to FIG. 3B, and FIG. 5B corresponds to FIG. 3C. In the following description, elements previously described with reference to FIGS. 1A to 4D may be identified by the same reference number without repeating the description, for brevity.

Referring to FIG. 5A, the sixth adhesive layer AL60 may include a first portion AL6-10, which is attached to a top surface of the first support portion PLT1-1, a second portion AL6-20, which is attached to a top surface of the second support portion PLT2-1, and a third portion AL6-30, which overlaps a top surface of the first protection portion PLT1-2 and a top surface of the second protection portion PLT2-2 and is not attached to the top surface of the first protection portion PLT1-2 and the top surface of the second protection portion PLT2-2. The third portion AL6-30 of the sixth adhesive layer AL60 may be cured and the sixth adhesive layer AL60 may be attached to the first cushion layer CL1. An adhesive property of the cured third portion AL6-30 may be removed.

Since the third portion AL6-30 supports the first cushion layer CL1 in the folded state but is not attached to the first cushion layer CL1, a stress, which is produced by the first and second protection portions PLT1-2 and PLT2-2, may not be transferred to an element on the first cushion layer CL1. Thus, a stress produced in the support layer PLT may not be transferred to the display panel DP and the window module WM (e.g., see FIG. 3A) disposed on the first cushion layer CL1.

As shown in FIG. 5B, the first grooves GV1 may be disposed in each of the top and bottom surfaces of the first support layer PLT1. The second grooves GV2 may be disposed in each of the top and bottom surfaces of the second support layer PLT2. According to the embodiment, the first region PLT1-21 of the first protection portion PLT1-2 and the first region PLT2-21 of the second protection portion PLT2-2 may be more easily bent, compared with the display device DD of FIG. 3C. This is because an effective elastic modulus of the first and second protection portions PLT1-2 and PLT2-2 is reduced due to the grooves GV1 and GV2, which are formed in both surfaces of the first and second protection portions PLT1-2 and PLT2-2.

Figure 6A:
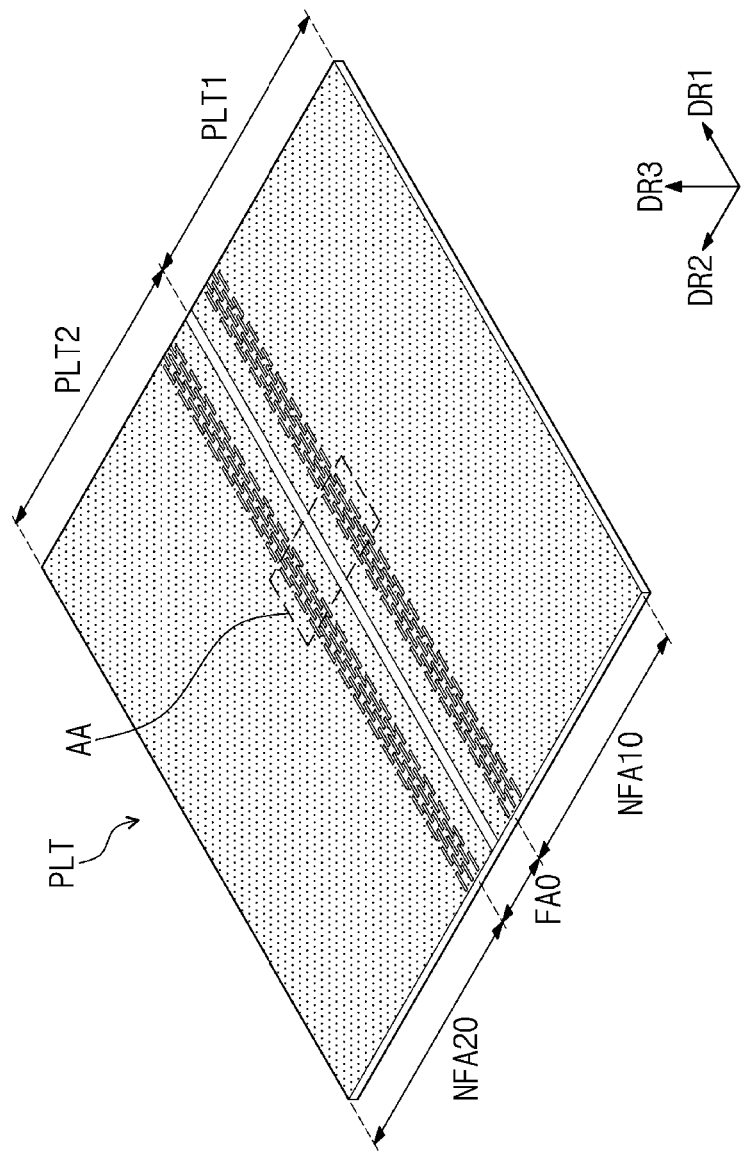
FIG. 6A is a schematic plan view illustrating a support layer according to an embodiment.
Figure 6B:
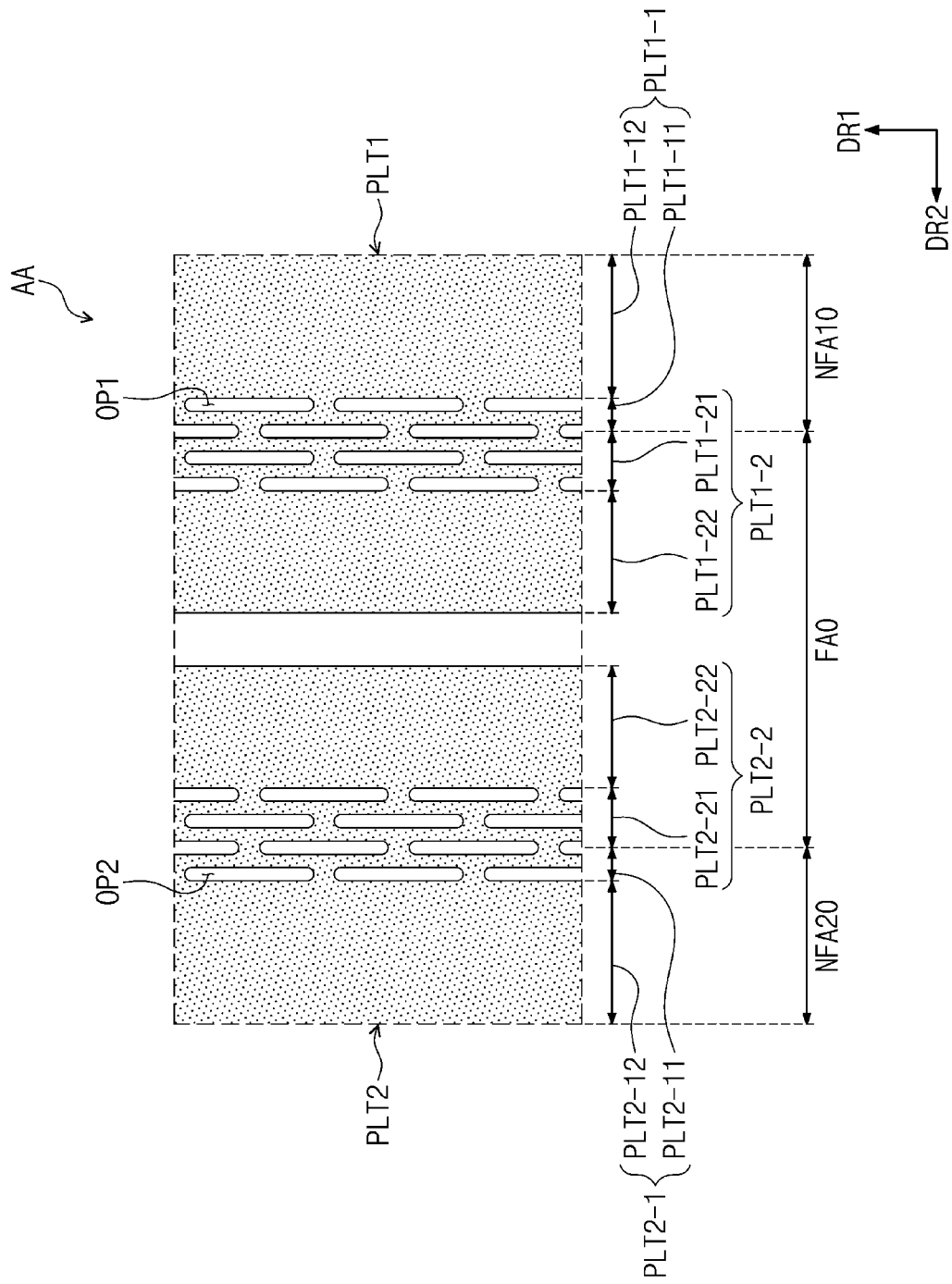
FIG. 6B is an enlarged schematic plan view illustrating a portion of the support layer of FIG. 6A.

FIG. 6A is a schematic plan view illustrating the support layer PLT according to an embodiment. FIG. 6B is an enlarged schematic plan view illustrating a region AA of FIG. 6A. FIG. 6C is an enlarged sectional view illustrating a portion of the display device DD, in which the support layer PLT of FIGS. 6A and 6B is provided. In the following description, elements previously described with reference to FIGS. 1A to 5B may be identified by the same reference number without repeating the description for brevity.

As shown in FIGS. 6A and 6B, first openings OP1 may be formed from the first region PLT1-11 of the first support portion PLT1-1 to the first region PLT1-21 of the first protection portion PLT1-2, and second openings OP2 may be formed from the first region PLT2-11 of the second support portion PLT2-1 to the first region PLT2-21 of the second protection portion PLT2-2.

The first openings OP1 and the second openings OP2 may be disposed in a grid or lattice shape. The first and second openings OP1 and OP2 may be disposed in the same shape, and the first and second protection portions PLT1-2 and PLT2-2 may have substantially the same elastic modulus.

The first region PLT1-21 of the first protection portion PLT1-2 and the first region PLT2-21 of the second protection portion PLT2-2, in which the first and second openings OP1 and OP2 are formed, may be more easily bent, compared with the first region PLT1-21 of the first protection portion PLT1-2 and the first region PLT2-21 of the second protection portion PLT2-2, in which the grooves GV1 and GV2 shown in FIG. 3C are formed.

In other examples, at least one of the first and second openings OP1 and OP2 may be replaced with the groove. In an embodiment, a density of the openings or grooves may be adjusted to obtain desired elastic moduli of the first region PLT1-11 of the first support portion PLT1-1 and the first region PLT1-21 of the first protection portion PLT1-2. In an embodiment, the first grooves GV1 may be disposed in the first region PLT1-11 of the first support portion PLT1-1, and the first openings OP1 may be disposed in the first region PLT1-21 of the first protection portion PLT1-2.

According to an embodiment, it may be possible to prevent or suppress a crease issue from occurring in a display device by repetitive folding and unfolding operations.

Due to a cover layer, it may be possible to prevent a contamination material from entering a folding region, during a transition step between the folding and unfolding operations.

While embodiments have been shown and described, it will be understood by one of ordinary skill in the art that variations in form and detail may be made therein without departing from the spirit and scope of the attached claims.

What is claimed is:

1. A display device, comprising:
a display panel including a first non-folding region, a second non-folding region, and a folding region disposed between the first non-folding region and the second non-folding region in a first direction; and
a lower member disposed below the display panel, wherein the lower member comprises:
a first support layer including:
a first support area aligned with and corresponding to the first non-folding region;
a first protection area extending from the first support area and aligned with a portion of the folding region; and
at least one of a first groove and a first opening disposed both in a first sub region of the first support area adjacent to the first protection area and in a first sub region of the first protection area adjacent to the first support area;
a second support layer including:
a second support area aligned with and corresponding to the second non-folding region;
a second protection area extending from the second support area and aligned with a portion of the folding region; and
at least one of a second groove and a second opening disposed both in a first sub region of the second support area adjacent to the second protection area and in a first sub region of the second protection area adjacent to the second support area; and
a cover layer disposed below and attached to the first support layer and the second support layer, and corresponding to the first non-folding region, the second non-folding region, and the folding region, wherein
the first support layer and the second support layer are spaced apart from each other by an empty space that is aligned with the folding region in case that the display panel is in an unfolded state.

2. The display device of claim 1, wherein
the at least one first groove is disposed in plural both in the first sub region of the first support area and in the first sub region of the first protection area, and
ones of the plurality of first grooves that are in the first sub region of the first support area are spaced apart from each other by a same uniform distance in the first direction as ones of the plurality of first grooves that are in the first sub region of the first protection area.

3. The display device of claim 2, wherein each of the plurality of first grooves have a same width, each of the plurality of first grooves being a recess and not a through hole.

4. The display device of claim 1, wherein
the at least one first opening is disposed in plural both in the first sub region of the first support area and in the first sub region of the first protection area, and
the plurality of first openings are disposed in a grid or lattice shape.

5. A display device, comprising:
a display panel including a first non-folding region, a second non-folding region, and a folding region disposed between the first non-folding region and the second non-folding region in a first direction; and
a lower member disposed below the display panel, wherein the lower member comprises:
a first support layer including:
a first support area aligned with and corresponding to the first non-folding region;
a first protection area extending from the first support area and aligned with the folding region; and
at least one of a first groove and a first opening disposed both in a first sub region of the first support area adjacent to the first protection area and in a first sub region of the first protection area adjacent to the first support area;
a second support layer including:
a second support area aligned with and corresponding to the second non-folding region;
a second protection area extending from the second support area and aligned with the folding region, and
at least one of a second groove and a second opening disposed both in a first sub region of the second support area adjacent to the second protection area and in a first sub region of the second protection area adjacent to the second support area; and
a cover layer disposed below and attached to the first support layer and the second support layer, and corresponding to the first non-folding region, the second non-folding region, and the folding region, wherein
the first protection area comprises a second region adjacent to the first sub region of the first protection area, and
the second region of the first protection area has an elastic modulus that is greater than an elastic modulus of the first sub region of the first protection area.

6. The display device of claim 5, wherein the second region of the first protection area has a uniform thickness in the first direction.

7. The display device of claim 1, wherein the first support layer and the second support layer comprise stainless steel or invar.

8. The display device of claim 1, wherein the cover layer has an elastic modulus that is smaller than an elastic modulus of the first support layer.

9. The display device of claim 1, wherein the cover layer comprises a cushion layer including a foamed resin layer or a silicone resin layer.

10. The display device of claim 9, wherein the cover layer further comprises a plastic resin layer disposed on a surface of the cushion layer.

11. The display device of claim 9, wherein
the cover layer further comprises a heat-dissipation layer disposed on a surface of the cushion layer, and
the heat-dissipation layer has a thermal conductivity that is higher than a thermal conductivity of the cushion layer.

12. The display device of claim 1, wherein
the lower member further comprises:
a first adhesive layer attached to a top surface of the first support area; and
a second adhesive layer attached to a top surface of the second support area, and
the first adhesive layer and the second adhesive layer are spaced apart from each other by a gap comprising an empty space in the first direction, wherein a top surface of each of the first protection area and the second protection area are absent of an adhesive layer.

13. The display device of claim 12, wherein, in case that the display device is in unfolded, a distance between the first adhesive layer and the second adhesive layer corresponds to a width of the folding region.

14. The display device of claim 1, wherein the lower member further comprises:
- a panel protection layer disposed between the display panel and the first support layer and between the display panel and the second support layer, the panel protection layer being comprised of a flexible plastic material;
- a cushion layer disposed between the panel protection layer and the first support layer and between the panel protection layer and the second support layer, the cushion layer being selected from a foamed resin and a sponge; and
- an adhesive layer to attach the panel protection layer to the display panel.

15. The display device of claim 1, wherein the lower member further comprises:
- a first adhesive layer attaching the first support area to the cover layer; and
- a second adhesive layer attaching the second support area to the cover layer, and the first adhesive layer and the second adhesive layer are spaced apart from each other by an empty space in the first direction.

16. The display device of claim 1, wherein the cover layer comprises:
- a first cover region corresponding to the folding region; and
- a second cover region corresponding to the first non-folding region, and in case that the display panel is in an unfolded state, a distance between the first cover region and the display panel is larger than a distance between the second cover region and the display panel.

17. The display device of claim 1, wherein the cover layer comprises:
- a first cover region corresponding to the folding region; and
- a second cover region corresponding to the first non-folding region, and
- a distance between the first cover region and the display panel is larger in case that the display panel is in an unfolded state than in case that the display panel is in a folded state.

18. The display device of claim 17, wherein
in case that the display panel is in the unfolded state, the first cover region of the cover layer is spaced apart from the first protection area of the first support layer, and
in case that the display panel is in the folded state, the first cover region of the cover layer contacts the first protection area of the first support layer.

19. The display device of claim 1, wherein the first protection area and the second protection area are spaced-apart from each other by the empty space having a distance in case that the display panel is in an unfolded state.

20. The display device of claim 1, wherein
each of the first protection area and the second protection area comprise a second sub region,
the second sub region of each of the first protection area and the second protection area are disposed between the first sub region of the first protection area and the first sub region of the second protection area, and
each of the second sub region of the first protection area and the second sub region of the first protection area are absent of any grooves or openings and are spaced apart from each other by the empty space.

21. The display device of claim 1, wherein
the cover layer is attached to the lower member only at locations aligned with the first and second non-folding regions,
the cover layer overlaps the lower member at locations aligned with the folding region in case that the display panel is in an unfolded state, and
the cover layer not being attached to any portion of the lower member at locations aligned with the folding region.

22. The display device of claim 1, wherein
each of the at least one of a first groove and a first opening being the first groove,
each of the at least one first groove being a recess and not a through hole,
each of the at least one of a second groove and a second opening being the second groove, and
each of the at least one second groove being a recess and not a through hole.

* * * * *